United States Patent
Roither et al.

[11] Patent Number: 6,031,404
[45] Date of Patent: Feb. 29, 2000

[54] ANALOG-SIGNAL TO SQUARE-WAVE-SIGNAL RESHAPING SYSTEM WITH OFFSET COMPENSATION

[75] Inventors: Gerhard Roither, München; Günther Hackl, Altotting; Uwe Fischer, Unterhaching, all of Germany

[73] Assignee: STMicroelectronics GmbH, Grasbrunn, Germany

[21] Appl. No.: 08/994,073

[22] Filed: Dec. 19, 1997

[30] Foreign Application Priority Data

Dec. 19, 1996 [DE] Germany ............... 196 53 189

[51] Int. Cl.[7] .................. H03L 5/00; H03K 12/00
[52] U.S. Cl. .................................... 327/307; 327/184
[58] Field of Search ...................... 327/104, 184, 327/172, 291, 307, 362, 337, 77; 330/9

[56] References Cited

U.S. PATENT DOCUMENTS

| | | | |
|---|---|---|---|
| 3,586,989 | 6/1971 | Wheable | 330/51 |
| 4,222,008 | 9/1980 | Mezrich | 327/184 |
| 4,297,642 | 10/1981 | Baldwin et al. | 330/9 |
| 4,686,385 | 8/1987 | Sharpe | 327/184 |
| 5,157,277 | 10/1992 | Tran et al. | 327/156 |
| 5,285,115 | 2/1994 | Tsuji | 307/362 |
| 5,315,260 | 5/1994 | Link et al. | 327/184 |
| 5,359,652 | 10/1994 | Mulder et al. | 379/386 |
| 5,394,023 | 2/1995 | Gleim et al. | 327/73 |
| 5,414,354 | 5/1995 | Bushman et al. | 327/184 |
| 5,519,352 | 5/1996 | Mo | 327/345 |

FOREIGN PATENT DOCUMENTS

| | | |
|---|---|---|
| 0 252 609 A2 | 1/1988 | European Pat. Off. . |
| 0 363 332 A2 | 4/1990 | European Pat. Off. . |
| 43 26 135 A1 | 2/1994 | Germany . |
| 62-111516 | 5/1987 | Japan . |
| 5-83095 | 4/1993 | Japan . |

OTHER PUBLICATIONS

Murray, John et al., "Design Considerations in Class D MOS Power Amplifiers" IEEE Trans. On Industrial Electronics and Control Instrumentation, vol. IECI–26, No. 4, Nov. 1979, pp. 211–218.

*Primary Examiner*—Toan Tran
*Assistant Examiner*—Quan Tra
*Attorney, Agent, or Firm*—Theodore E. Galanthay; E. Russell Tarleton; Seed and Berry LLP

[57] ABSTRACT

An analog-signal to square-wave-signal reshaping system for threshold-dependent reshaping of an analog input signal to a square wave signal; comprising an offset-inflicted reshaping circuit having a signal input adapted to be fed with the analog input signal, a reference input adapted to be fed with a reference voltage determining the reshaping threshold, and a signal output from which the square wave signal is available; an offset storage circuit connected to the signal input of the reshaping circuit and adapted to store a charging voltage corresponding to the offset voltage of the reshaping circuit, with this charging voltage being adapted to be superimposed on the analog input signal for offset compensation; a controllable switch circuit which in a first switching state takes no influence on the reshaping function of the reshaping circuit and, for the purpose of offset compensation, in a second switching state interrupts the reshaping operation of reshaping circuit and effects charging of the offset storage circuit to the charging voltage corresponding to the respective offset voltage; a detector circuit by means of which a detection signal can be generated at least approximately at those times at which the analog input signal passes a predetermined detection threshold; a delay circuit by means of which the detection signal can be delayed by a predetermined delay period; and a switch control circuit, by means of which, upon occurrence of the delayed detection signal, the switch circuit can be driven to the second switching state for a predetermined window time duration; with the window time duration lying between the adjacent edges of the square wave signal.

22 Claims, 2 Drawing Sheets

ANALOG-SIGNAL TO SQUARE-WAVE-SIGNAL RESHAPING SYSTEM WITH OFFSET COMPENSATION

TECHNICAL FIELD

The invention relates to an analog-signal square-wave-signal reshaping system for threshold-dependent reshaping of an analog input signal to a square wave signal. Such reshaping is employed for example in connection with pulse width modulation, Radio Data System (RDS) biphase demodulation, transformation of sinusoidal waves to square waves and, expressed quite generally, for the square-wave delimitation of analog signals.

BACKGROUND OF THE INVENTION

As known, reshaping circuits require predetermined threshold values as discrimination thresholds for the decision whether the square-wave signal has a high or a low signal value. Such discrimination thresholds are normally produced with the aid of comparators, which however are offset-inflicted, resulting in falsification of the discrimination threshold. CMOS comparators, which are often used in particular for monolithically integrated semiconductor circuits, display particularly high offset voltages and thus cause a particularly high falsification of the discrimination threshold.

For example, when sinusoidal or triangular analog signals are to be converted to square wave signals in threshold-dependent manner, the offset voltage of such a comparator causes virtually shifting of the discrimination threshold, which causes a change in the square wave pulse lengths as compared to that case in which the desired discrimination threshold is available in unfalsified manner. For example in connection with pulse width modulation or processing of RDS radio signals on the receiver side, such pulse width falsification is highly undesirable.

SUMMARY OF THE INVENTION

It is therefore an object of the invention to provide an analog-signal to square-wave-signal reshaping system that the reshaping or discrimination threshold of which is not falsified by an offset error of the reshaping circuit used.

This object is met by the features indicated in the claims appended hereto.

The invention therefore consists in the reshaping system for threshold-dependent reshaping of an analog input signal to a square wave signal; comprising an offset-inflicted reshaping circuit having a signal input that can be fed with the analog input signal, a reference input that can be fed with a reference voltage determining the reshaping or discrimination threshold, and a signal output from which the square wave signal is available; an offset storage capacitor connected to the signal input of the reshaping circuit and adapted to store a charging voltage corresponding to the offset voltage of the reshaping circuit, with this charging voltage being adapted to be superimposed on the analog input signal for offset compensation; a controllable switch circuit which in a first switching state takes no influence on the reshaping function of the reshaping circuit and, for the purpose of offset compensation, in a second switching state interrupts the reshaping operation of the reshaping circuit and effects charging of the offset storage capacitor to the charging voltage corresponding to the respective offset voltage; a detector circuit by means of which a detection signal is generated at least approximately at those times at which the analog input signal passes a predetermined detection threshold; a delay circuit by means of which the detection signal can be delayed by a predetermined period of time; and a switch control circuit by means of which, upon occurrence of the delayed detection signal, the switch circuit can be driven to the second switching state for a predetermined state for a predetermined window time duration, with the window duration lying between the pulse edges of the square wave signal.

In the reshaping system according to the invention, operations for offset measurement and for storing the measured offset value in the offset storage capacitor are carried out during such time sections which the square wave signal resulting from such reshaping does not change its amplitude value, thus avoiding loss of information.

In a preferred embodiment, during those time windows which offset measuring and storing is carried out, the signal value of the square wave signal present before the beginning of the time window is stored temporarily by means of a latch or sample and hold circuit, so that a load connected to the reshaping system does not notice anything of this offset measuring and storing operation.

In an embodiment of the invention, the reshaping circuit comprises an offset-inflicted comparator and the switch circuit comprises a switch connected between the signal input and the signal output of the comparator, which in the first switching state is rendered non-conducting and in the second switching state is rendered conducting. With this embodiment, the offset storage capacitor is connected in series between the output of an input signal source delivering the analog input signal and the signal input of the comparator.

In an embodiment of the invention, the reshaping system comprises two monostable multivibrators, one thereof delivering a first delay pulse and the second delivering a time window pulse. The first multivibrator is set by the detection signal, whereas the second multivibrator is set by the pulse edge at the end of the delay pulse. The switch circuit is driven to the second switching state during the duration of the time window pulse.

When the reshaping system according to the invention is used in an RDS radio receiver, the RDS component transmitted along with the transmission signal without RDS carrier and arriving in the receiver as analog signal is reshaped by said reshaping system to a square wave signal that is fed to an RDS-PLL circuit for restoring the RDS carrier on the receiver side. The zero crossings of the restored RDS signal are detected by means of the detection circuit and time windows are produced after the predetermined delay with respect to the zero passages, with the aid of the delay circuit and the switch control circuit. For producing delay and time windows, a monostable multivibrator each can be used here as well.

The invention will be explained now in more detail by way of non-limitative examples of embodiments shown in the attached drawings.

DETAILED DESCRIPTION OF THE INVENTION

Figure 1:
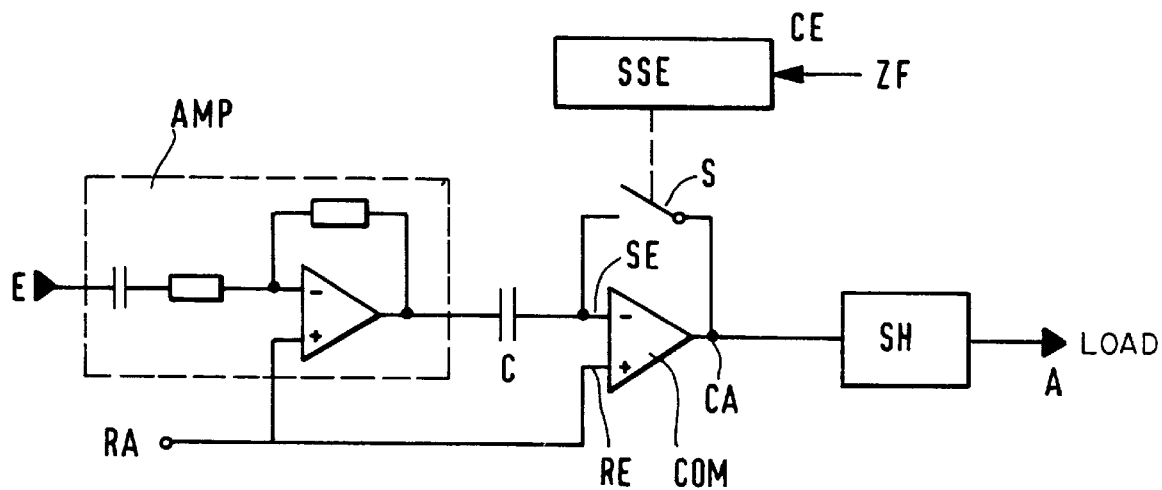
FIG. 1 shows an embodiment of an analog-signal to square-wave-signal reshaping system according to the invention.

The circuit arrangement shown in FIG. 1 comprises an analog signal amplifier AMP of known per se construction, so that it will not be explained in more detail. A signal input E is fed with an analog input signal which, after amplification by means of the amplifier AMP is fed via a capacitor C to an inverting signal input SE of an offset-inflicted comparator COM. A non-inverting reference input RE is connected to a reference voltage terminal RA fed with a so-called middle voltage, which is, e.g., +2.5 V with usual integrated circuits with a supply voltage of +5 V. This voltage value of +2.5 V usually is also present as d.c. voltage value on the connection path between an output of the amplifier AMP and the signal input SE of comparator COM.

Between the signal input SE of the comparator COM and a comparator output CA, there is connected a switch circuit S whose switching state is controllable by a switch control circuit SSE. The comparator output CA is passed to a latch or sample and hold circuit SH, the output of which constitutes an output A of the analog-signal to square-wave-signal reshaping system. Switching control circuit SSE has a control input CE via which it receives time control signals.

When the switch S is switched to an open or non-conducting state, the comparator COM is in the comparator mode of operation. When the switch S is controlled to its conducting state, the comparator operation of COM is deactivated, and it is possible to perform a measurement of the offset voltage of the comparator COM.

If the comparator COM were offset-free, and when the analog input signal supplied to the signal input SE thereof rises from a value below 2.5 V to a value above 2.5 V, a potential change from high potential to low potential would occur at the output CA of the comparator COM at the time at which the analog input signal passes the middle voltage value of +2.5 V. When the comparator has an offset voltage, of e.g. +10 mV, the potential change at comparator output CA will, therefore, not take place before the analog input signal at signal input SE of the comparator COM passes the voltage value of +2.51 V.

For the preparation of an offset compensation operation, the switch S is rendered conducting. If the comparator COM were offset-free, the middle voltage value of +2.5 V would be present on both inputs SE and RE thereof as well as on its output CA. Due to the offset error of the comparator COM, however, a different voltage value appears at its signal input SE, which in the example assumed above is a voltage value of +2.51 V, i.e., a voltage value that is higher than the middle voltage value by 10 mV. As a side of the capacitor C directed towards the amplifier AMP displays the middle voltage of +2.5 V, whereas a side of the capacitor C directed towards signal input SE of the comparator COM displays the voltage value +2.51 V that has been increased due to the offset voltage, the capacitor C is charged to the voltage difference of +10 mV, i.e., exactly to the offset voltage of the comparator COM. When the switch S, after conclusion of the offset measuring and storing operation, is again rendered non-conducting, the d.c. voltage of 10 mV stored in the capacitor C is superimposed on the analog input signal then fed to the signal input SE of the comparator COM. For example, when the analog output signal of the amplifier AMP has reached the voltage value +2.5 V, which would not yet suffice for switching over the output potential of the comparator COM, this analog signal value has the offset voltage value superimposed thereon that is stored in the capacitor C, so that at this moment the signal input SE of the comparator COM is fed with the correspondingly increased voltage value of +2.51 V, which results in switching over of the output potential of the comparator COM.

The capacitor C thus has a function of a memory for the offset voltage of the comparator COM.

Figure 3:
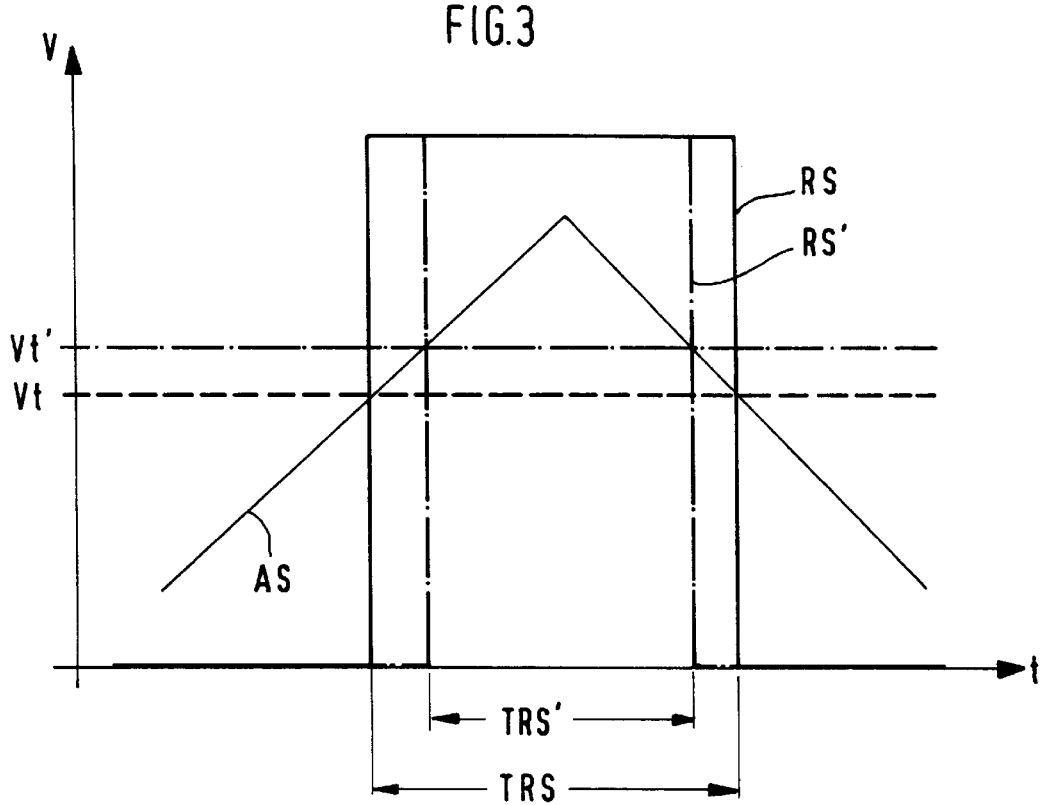
FIG. 3 shows signal patterns for elucidating analog-signal to square-wave-signal reshaping with and without offset error.
Figure 4:
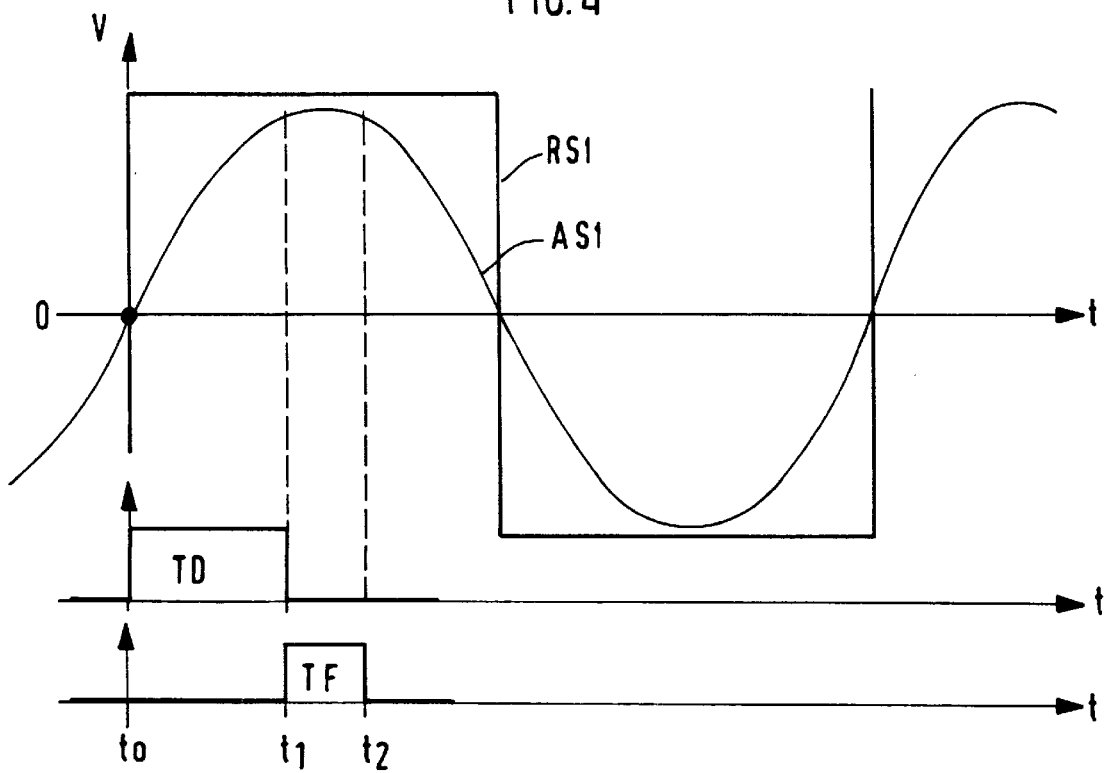
FIG. 4 shows a representation of sinusoidal-signal to square-wave-signal reshaping with delay and time window pulses.

The offset influences in analog-signal to square-wave-signal reshaping and the time control with the offset compensation method according to the invention will now be considered by way of FIGS. 3 and 4, respectively.

FIG. 3 shows a triangular analog signal AS which is to be reshaped to a first square-wave signal RS, shown in full line, by using a voltage threshold value Vt as a discrimination threshold, as shown in broken lines. With a correct discrimination threshold, the pulse of the first square wave signal RS shown in FIG. 3 has a duration TRS.

An offset error of the comparator COM has the effect of shifting of the discrimination threshold, as if reshaping were carried out using a voltage threshold value Vt' shown in a dot-and-dash line. With such an offset-distorted discrimination threshold, one obtains a second square wave signal RS' shown in a dot-and-dash line, having a square wave pulse length TRS'.

The distance between Vt and Vt' corresponds to an offset voltage Voffset of the comparator COM.

Figure 2:
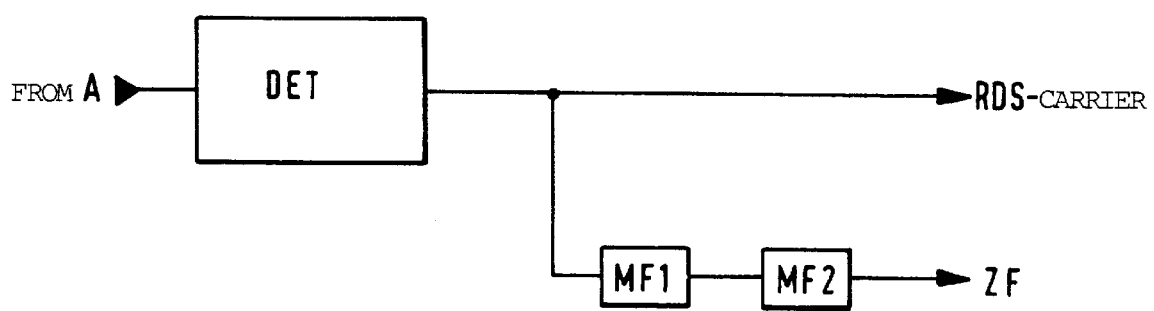
FIG. 2 shows an embodiment of a delay and switch control circuit that can be used in conjunction with FIG. 1.

According to the invention, offset voltage measurement and offset voltage storing is carried out during a time window which is between adjacent edges of the reshaped square wave signal, in a predetermined distance from each of these two edges. This can be achieved by means of a circuit arrangement shown in FIG. 2, comprising a detector circuit DET issuing a detection signal when the analog signal passes a specific detection threshold value. This may be for example the zero crossing of the analog signal. Upon determination of the detection threshold value, detector circuit DET produces a detection signal which is supplied to a series connection of a first monostable multivibrator MF1 and a second monostable multivibrator MF2. The multivibrator MF1 produces a delay pulse ZD having a delay pulse duration TD, while the second multivibrator MF2 produces a time window pulse ZF having a time window duration TF. The time window pulse ZF is fed to the control input CE of the switch control circuit SSE in FIG. 1. While the time window pulse ZF is being supplied, the switch control circuit SSE controls the switch S to the conducting state.

Shown in FIG. 4 is the reshaping of a sinusoidal analog signal AS1 to a square wave signal RS1 with a discrimination threshold of 0 V. It is assumed in this respect that the detector circuit DET detects the zero crossings, i.e., the times at which the analog signal AS1 passes the voltage value 0 V. This time is designated as t0 in FIG. 4.

At the time t0, the detector circuit DET thus produces a detection signal creating a delay pulse ZD lasting until t1. The end thereof at t1 triggers the time window pulse ZF lasting until t2, which has the consequence that the switch S is rendered conducting between t1 and t2. As shown in FIG. 4, the time window pulse ZF appears during a time in which the signal value of the square wave signal RS1 does not change. With the aid of the latch circuit SH, the signal value of the square wave signal RS1 existing before t1 is maintained for the load connected to the output A. The time window duration TF need not be longer than the time which is required for measuring the offset value of the comparator COM and for storing the same in the capacitor C.

The offset measuring and scoring operation need not necessarily be carried out during each square wave pulse of square wave signal RS or RS1. Even in case of a stronger drift of the offset value, such offset measuring and storing would be sufficient if performed in greater intervals than in every square half-wave. Accordingly, in some embodiments, the time window pulse ZF is produced in every square wave and in another embodiment, is produced only in every other square wave or every third or fourth square wave, or less often.

When the reshaping system shown in FIG. 1 is used for receiver-side processing of an RDS signal in a radio receiver, the reshaping system shown in FIG. 1 is used for converting the analog (approximately sinusoidal) RDS signal arriving at the receiver to a square wave signal by means of the comparator COM, with said square wave signal being available at the output of the comparator COM. Starting from the output A, this square wave signal is fed to an RDS-PLL circuit, through which the RDS carrier is restored on the receiver side, which on the transmitter side has been suppressed prior to the transmission. Due to the fact that the restored carrier is synchronized with the received RDS signal by means of the RDS-PLL circuit, the zero crossings of the restored RDS carrier can be utilized as temporal reference points for the generation of the delay pulse ZD and the time window pulse ZF. The detector circuit DET, at the zero crossings of the restored RDS carrier, then produces in each case the detection signal which, with the aid of the first and the second multivibrator (MF1 and MF2), then leads to the delay pulse ZD and the time window pulse ZF according to FIG. 4, respectively.

In an alternative embodiment, the input to the detector circuit is taken from the analog input signal at node E or from node SE and is not taken from the digital output at node A. This permits use of the analog input signal to generate a detection signal.

From the foregoing it will be appreciated that, although specific embodiments of the invention have been described herein for purpose of illustration, various modifications may be made without deviating from the spirit or scope of the invention. Accordingly, the invention is not limited except as by the appended claims.

What is claimed is:

1. An offset-compensated analog-signal to square-wave-signal reshaping system for threshold-dependent reshaping of an analog input signal to a square wave signal, comprising:

an offset-inflicted reshaping circuit having a signal input adapted to be fed with the analog input signal, a reference input adapted to be fed with a reference voltage determining the reshaping threshold, and a signal output from which the square wave signal is available;

an offset storage circuit connected to the signal input of the reshaping circuit and adapted to store a charging voltage corresponding to an offset voltage of the reshaping circuit, said charging voltage being adapted to be superimposed on the analog input signal for offset compensation;

a controllable switch circuit connected between the signal input and the signal output of the reshaping circuit and which in a first switching state takes no influence on the reshaping function of the reshaping circuit and, for the purpose of offset compensation, in a second switching state interrupts the reshaping operation of reshaping circuit and effects charging of the offset storage circuit to the charging voltage corresponding to the respective offset voltage;

a detector circuit by means of which a detection signal can be generated at least approximately at those times at which the analog input signal passes a predetermined detection threshold, the detector circuit coupled to receive the analog input signal and coupled to a control input of the controllable switch circuit;

a delay circuit by means of which the detection signal can be delayed by a predetermined delay period, the delay circuit coupled to the detector circuit to receive the detection signal; and a switch control circuit coupled to the delay circuit and the controllable switch circuit, by means of which, upon occurrence of the delayed detection signal, the switch circuit can be driven to the second switching state for a predetermined window time duration with the window time duration lying between the edges of the square wave signal.

2. The reshaping system of claim 1 wherein the reshaping circuit comprises an offset-inflicted comparator, and the switch circuit comprises a switch connected between the signal input and the signal output of the comparator, said switch being non-conducting in the first switching state and being conducting in the second switching state.

3. The reshaping system of claim 2 wherein a CMOS comparator is provided.

4. The reshaping system of claim 1 wherein the offset storage circuit is constituted by a capacitor connected between a signal source and the signal input of the reshaping circuit.

5. The reshaping system of claim 1 wherein a latch circuit is connected between the signal output of the reshaping circuit and a load receiving the square-wave signal, said latch circuit being adapted to temporarily store, during the window time duration, the signal value of the square wave signal present before the beginning of the window time duration and to supply this value to the load.

6. The reshaping system of claim 1 wherein the delay circuit comprises a first monostable multivibrator having an input being fed with the detection signal and in response to the detection signal generating a delay pulse having a pulse duration corresponding to the delay duration.

7. The reshaping system of claim 6 wherein a second monostable multivibrator is provided, an input of said second multivibrator being connected to an output of the first monostable multivibrator and which upon occurrence of the trailing edge of the delay pulses generates a time window pulse having a pulse duration corresponding to the window time duration, with the switch circuit being adapted to be driven to the second switching state during the duration of the time window pulse.

8. An RDS receiving circuit comprising:

an analog-signal to square-wave-signal reshaping system for threshold-dependent reshaping of an analog input signal to a square wave signal, comprising:

an offset-inflicted reshaping circuit having a signal input adapted to be fed with the analog input signal, a reference input adapted to be fed with a reference voltage determining the reshaping threshold, and a signal output from which the square wave signal is available;

an offset storage circuit connected to the signal input of the reshaping circuit and adapted to store a charging voltage corresponding to an offset voltage of the reshaping circuit, said charging voltage being adapted to be superimposed on the analog input signal for offset compensation;

a controllable switch circuit connected between the signal input and the signal output of the reshaping circuit and which in a first switching state takes no influence on the reshaping function of the reshaping circuit and, for the purpose of offset compensation, in a second switching state interrupts the reshaping operation of reshaping circuit and effects charging of the offset storage circuit to the charging voltage corresponding to the respective offset voltage;

a detector circuit by means of which a detection signal can be generated at least approximately at those times at which the analog input signal passes a predetermined detection threshold, the detector circuit coupled between the reshaping signal output and a control input of the controllable switch circuit;

a delay circuit by means of which the detection signal can be delayed by a predetermined delay period, the delay circuit coupled to the detector circuit to receive the detection signal;

a switch control circuit coupled to the delay circuit and the controllable switch circuit, by means of which, upon occurrence of the delayed detection signal, the switch circuit can be driven to the second switching state for a predetermined window time duration with the window time duration lying between the edges of the square wave signal; and an RDS-PLL circuit connected downstream of the reshaping system for restoring, on the receiver side, the RDS carrier suppressed on the transmitter side, with the zero crossings of the restored RDS signal being detectable by means of the detector circuit.

9. An analog-signal to square-wave-signal reshaping system, comprising:

a reshaping circuit having a signal input, a reference input, and a signal output;

an offset storage circuit coupled to the signal input of the reshaping circuit;

a controllable switch circuit coupled between the signal output and the signal input of the reshaping circuit;

a switch control circuit coupled to said switch circuit, said switch control circuit having a control input to receive a time window signal, said time window signal causing said controllable switch circuit to close to charge said offset storage circuit to an offset compensation voltage; and a detection circuit coupled to a control input of the switch control circuit and configured to receive a periodic signal and generate the time window signal.

10. The reshaping system of claim 9 wherein the reshaping circuit comprises a comparator circuit.

11. The reshaping system of claim 9 wherein the offset storage circuit comprises an offset storage capacitor.

12. The reshaping system of claim 9 wherein the controllable switch circuit comprises an electronic switch.

13. The reshaping system of claim 9 wherein the detection circuit is coupled between a system output of said reshaping system and the control input of the switch control circuit, said detection circuit providing said time window signal to said control input of said switch control circuit.

14. The detection circuit of claim 13, further comprising a first and a second monostable multivibrator connected in series to each other and to said detection circuit.

15. The detection circuit of claim 14 wherein said first multivibrator provides a delay pulse having a delay pulse duration and said second multivibrator provides said time window signal having a time window duration.

16. The detection circuit of claim 15 wherein said time window duration of said time window signal happens within two adjacent edges of a square wave signal.

17. The reshaping system of claim 9, further comprising a latch circuit coupled between the signal output of the reshaping circuit and the system output of the reshaping system.

18. The reshaping system of claim 9, further comprising an analog signal source, said analog signal source coupled to said offset storage circuit and providing an analog input signal.

19. A method for reshaping an analog-signal to a square-wave-signal by an electric circuit, said electric circuit having a comparator circuit, a feedback switch, a switch control circuit, and an offset storage capacitor circuit, said method comprising:

receiving an analog input signal into the electric circuit;

superimposing an offset voltage present in the offset storage capacitor circuit upon the analog input signal;

generating a first pulse edge of the square wave signal by the comparator circuit when the analog input signal added together with the offset voltage reaches a threshold voltage value;

generating a time window pulse after a predetermined delay of the first pulse edge of the square wave signal;

providing the time window pulse into the switch control circuit to render the feedback switch in the conducting state;

charging the offset storage capacitor circuit through the feedback switch to establish an offset voltage; and rendering the feedback switch in the non-conducting state.

20. An analog-signal to square-wave-signal reshaping system, comprising:

a reshaping circuit having a signal input, a reference input, and a signal output;

an offset storage circuit coupled to the signal input of the reshaping circuit;

a controllable switch circuit coupled between the signal output and the signal input of the reshaping circuits;

a controllable switch circuit coupled to the switch circuit, the controllable switch circuit having a control input to receive a time window signal, the time window signal causing the controllable switch circuit to close to charge the offset storage circuit to an offset compensation voltage; and a detection circuit coupled between a system output of the reshaping system and the control input of the controllable switch circuit, the detection circuit providing the time window signal to the control input of the switch control circuit.

21. An analog-signal to signal-wave-signal reshaping system, comprising:

a reshaping circuit having a signal input, a reference input, and a signal output;

an offset storage circuit coupled to the signal input of the reshaping circuit;

a controllable switch circuit coupled between the signal output and the signal input of the reshaping circuit;

a switch control circuit coupled to the switch circuit, the switch control circuit having a control input to receive a time window signal, the time window signal causing the controllable switch circuit to close to charge the offset storage circuit to an offset compensation voltage; and a latch circuit coupled between the signal output of the reshaping circuit and the system output of the reshaping system.

22. An analog-signal to square-wave-signal reshaping system, comprising:

a reshaping circuit having a signal input, a reference input, and a signal output;

an offset storage circuit coupled to the signal input of the reshaping input;

a controllable switch circuit coupled between the signal output and the signal input of the reshaping circuit;

a switch control circuit coupled to the switch circuit, the switch control circuit having a control input to receive a time window signal, the time window signal causing the controllable switch circuit to close to charge the offset storage circuit to an offset compensation voltage; and a detection circuit coupled to the signal input and to the control input of the switch control circuit.

* * * * *